(12) United States Patent
Tsai et al.

(10) Patent No.: US 10,892,210 B2
(45) Date of Patent: Jan. 12, 2021

(54) PACKAGE STRUCTURES

(71) Applicant: Delta Electronics, Inc., Taoyuan (TW)

(72) Inventors: Hsin-Chang Tsai, Taoyuan (TW); Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/283,963

(22) Filed: Oct. 3, 2016

(65) Prior Publication Data
US 2018/0096921 A1 Apr. 5, 2018

(51) Int. Cl.
*H01L 23/495* (2006.01)
*H01L 23/31* (2006.01)
*H01L 23/00* (2006.01)

(52) U.S. Cl.
CPC .... *H01L 23/49562* (2013.01); *H01L 23/3107* (2013.01); *H01L 23/49524* (2013.01); *H01L 23/49541* (2013.01); *H01L 23/49548* (2013.01); *H01L 23/49551* (2013.01); *H01L 23/49575* (2013.01); *H01L 24/73* (2013.01); *H01L 24/13* (2013.01); *H01L 24/16* (2013.01); *H01L 24/37* (2013.01); *H01L 24/40* (2013.01); *H01L 2224/0237* (2013.01); *H01L 2224/0239* (2013.01); *H01L 2224/13124* (2013.01); *H01L 2224/13147* (2013.01); *H01L 2224/16245* (2013.01); *H01L 2224/37147* (2013.01); *H01L 2224/40245* (2013.01); *H01L 2224/73255* (2013.01); *H01L 2924/00014* (2013.01); *H01L 2924/01029* (2013.01); *H01L 2924/0665* (2013.01); *H01L 2924/1306* (2013.01);
(Continued)

(58) Field of Classification Search
CPC ......... H01L 23/49517; H01L 23/49541; H01L 23/49537; H01L 23/49548; H01L 23/49562; H01L 23/49551
See application file for complete search history.

(56) References Cited

U.S. PATENT DOCUMENTS 8,283,758 B2 * 10/2012 Jiang .................... H01L 21/565
257/673
8,884,420 B1 * 11/2014 Hosseini ........... H01L 23/49575
257/676

(Continued)

FOREIGN PATENT DOCUMENTS

TW 201021179 A 6/2010
TW 201501246 A 1/2015

*Primary Examiner* — Zandra V Smith
*Assistant Examiner* — Abbigale A Boyle
(74) *Attorney, Agent, or Firm* — Muncy, Geissler, Olds & Lowe, PC (57) ABSTRACT

A package structure is provided. The package structure includes a leadframe including a plurality of connection portions; a device including a substrate, an active layer disposed on the substrate and a plurality of electrodes disposed on the active layer, wherein the electrodes of the device are connected to the connection portions of the leadframe; a conductive unit having a first side and a second side, wherein the first side of the conductive unit connects to the substrate of the device and the conductive unit connects to at least one of the connection portions of the leadframe; and an encapsulation material covering the device and the leadframe, wherein the second side of the conductive unit is exposed from the encapsulation material.

16 Claims, 4 Drawing Sheets

(52) U.S. Cl.
CPC .............. *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 2004/0061221 A1* | 4/2004 | Schaffer | H01L 25/072 257/723 |
| 2009/0115035 A1* | 5/2009 | Bayan | H01L 23/4951 257/673 |
| 2014/0061884 A1* | 3/2014 | Carpenter | H01L 23/49524 257/676 |
| 2014/0175628 A1* | 6/2014 | Pan | H01L 24/37 257/676 |
| 2015/0028461 A1 | 1/2015 | Gatterbauer et al. | |
| 2015/0041984 A1* | 2/2015 | Otremba | H01L 23/49575 257/773 |
| 2015/0097284 A1* | 4/2015 | Uzoh | H01L 23/49811 257/737 |

\* cited by examiner

//PACKAGE STRUCTURES

BACKGROUND OF THE INVENTION

Field of the Invention

The invention relates to a package structure, and more particularly to a package structure with at least partial exposed conductive unit.

Description of the Related Art

Flip chip packaging describes a method of electrically connecting a die to a package carrier. The package carrier, either a substrate or a leadframe, then provides a connection from the die to the exterior of the package. In "standard" packaging, the interconnection between the die and the carrier is made using wires. The die is attached to the carrier face-up, and then the wires are bonded first to the die, then looped and bonded to the carrier. The wires are typically 1-5 mm in length, and 15-35 µm in diameter.

In contrast, the interconnection between the die and the carrier in the flip chip packaging is made through a conductive "bump" that is placed directly on the die surface. The bumped die is then "flipped over" and placed face-down, with the bumps connecting directly to the carrier. A bump is typically 60-100 µm high, and 80-125 µm in diameter. The flip chip connection is generally formed in one of two ways: using solder or using conductive adhesive.

Using the flip chip interconnection offers a number of possible advantages to the user: signal inductance is reduced, because the interconnection is much shorter in length (0.1 mm vs 1-5 mm), and the inductance of the signal path is greatly reduced. This is a key factor in high-speed communication and switching devices; power/ground inductance is reduced—using the flip chip interconnection, and power can be brought directly into the core of the die, rather than having to be routed to the edges. This greatly decreases the noise of the core power, improving performance of the silicon; signal density is high, as the entire surface of the die can be used for interconnection, rather than just the edges. This is similar to the comparison between QFP and BGA packages, because the flip chip can connect over the surface of the die, it can support a vastly larger number of interconnections on the same die size; and the die is shrunk—for a pad-limited die (a die whose size is determined by the edge space required for bond pads), the size of the die can be reduced, saving on silicon cost.

Additionally, in contrast to the traditional method of die attachment by wire bonding, high-power packages and discrete devices such as metal oxide semiconductor field effect transistors (MOSFETs), insulated gate bipolar transistors (IGBTs), and switched output differential structure (SODs) use a copper clip to connect the die to a basic substrate and/or a leadframe. A clip bonding technology replaces the standard wire-bond connection between the die and the leadframe by a solid copper bridge.

However, the solid copper bridge (i.e. a copper clip) used in the clip bonding package is also encapsulated by an encapsulation material such that the heat dissipation effect of the encapsulated copper clip is reduced.

Therefore, the development of a package structure which is formed using a flip chip and clip bonding technologies capable of achieving a good heat dissipation effect is desirable.

BRIEF SUMMARY OF THE INVENTION

One embodiment of the invention provides a package structure including a leadframe including a plurality of connection portions; a device including a substrate, an active layer disposed on the substrate and a plurality of electrodes disposed on the active layer, wherein the electrodes of the device are connected to the connection portions of the leadframe; a conductive unit having a first side and a second side, wherein the first side of the conductive unit connects to the substrate of the device and the conductive unit connects to at least one of the connection portions of the leadframe; and an encapsulation material covering the device and the leadframe, wherein the second side of the conductive unit is exposed from the encapsulation material.

In some embodiments, the connection portions of the leadframe include a first connection portion connected to the electrode of the device with high-potential and a second connection portion connected to the electrode of the device with low-potential.

In some embodiments, the device includes a lateral power component.

In some embodiments, the electrodes include a source electrode and a drain electrode.

In some embodiments, the source electrode is connected to the second connection portion of the leadframe and the drain electrode is connected to the first connection portion of the leadframe.

In some embodiments, the conductive unit includes copper.

In some embodiments, the conductive unit is connected to the second connection portion of the leadframe.

In some embodiments, the package structure further includes a redistribution layer disposed between the electrodes of the device and the connection portions of the leadframe.

In some embodiments, the redistribution layer includes an insulation layer and a metal layer disposed thereon.

In some embodiments, the conductive unit includes a clip.

One embodiment of the invention provides a package structure including a leadframe including a first connection portion and a second connection portion; a device connected to the first connection portion of the leadframe with high-potential and the second connection portion of the leadframe with low-potential; a conductive unit connected to the device and the second connection portion of the leadframe with low-potential; and an encapsulation material covering the device and the leadframe, exposing at least a portion of the conductive unit.

In some embodiments, the device is connected to the first connection portion and the second connection portion of the leadframe through a plurality of electrodes disposed above the device.

In one embodiment of the present invention, a lateral power component is attach on a leadframe through drain and source electrodes using a flip chip technology. Current flows from the high-potential drain electrode to the low-potential source electrode through an active layer without flowing through a semiconductor substrate which is capable of avoiding parasitic resistance and inductance produced by the semiconductor substrate while operating. Additionally, the conductive unit is extended from the semiconductor substrate to the low-potential connection portion of the leadframe, replacing conventional wire bonding requiring two wires extended from both ends of the semiconductor substrate to the leadframe, which is capable of effectively reducing the entire package size.

Furthermore, the package structure with the exposed conductive unit (i.e. the package structure with at least a portion of the conductive unit uncovered by the encapsulation material) is capable of achieving good heat dissipation and improving device performance.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
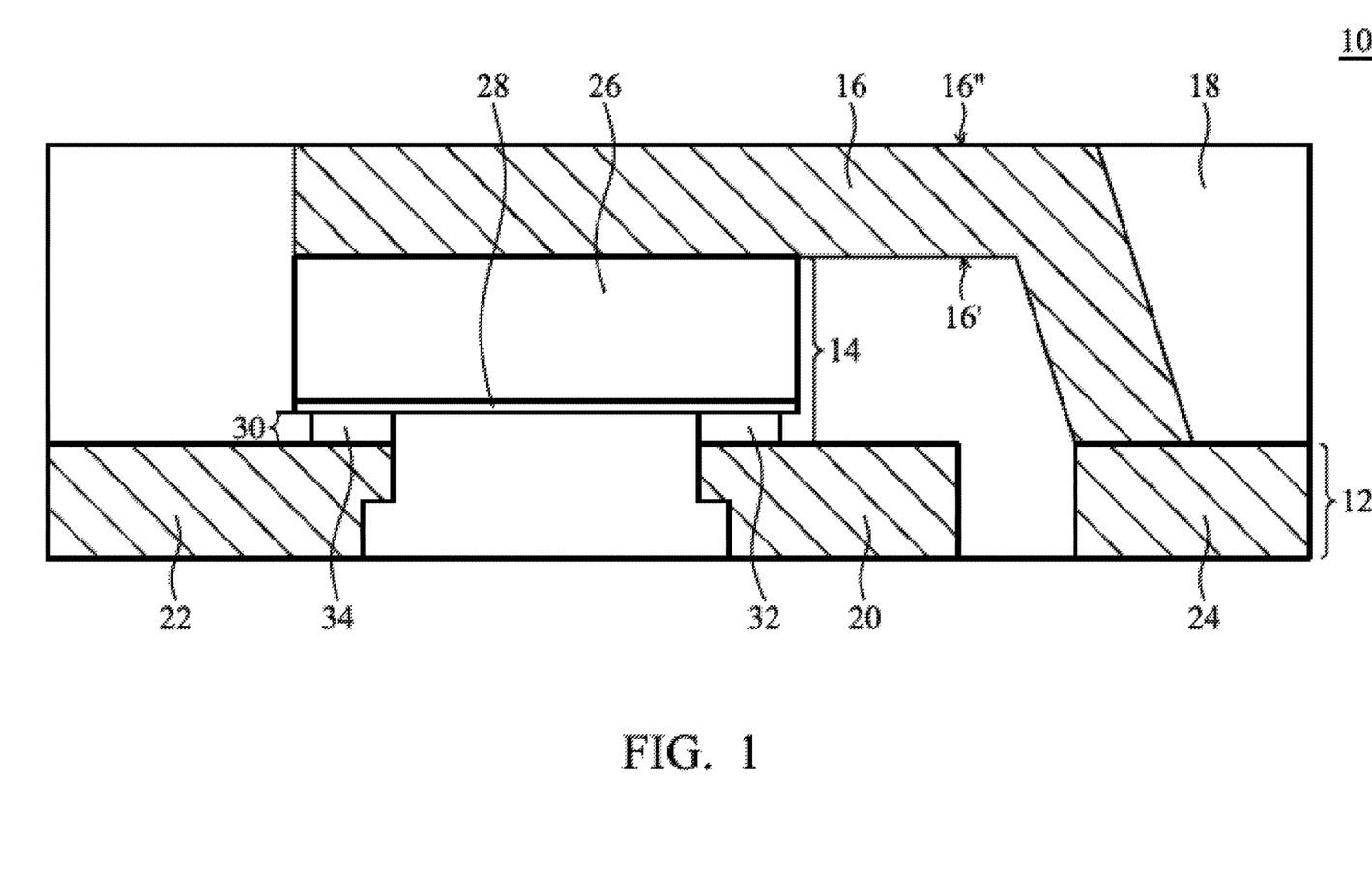
FIG. 1 is a cross-sectional view of a package structure in accordance with one embodiment of the invention.

Referring to FIG. 1, in accordance with one embodiment of the invention, a package structure 10 is provided. FIG. 1 is a cross-sectional view of the package structure 10.

The package structure 10 includes a leadframe 12, a device 14, a conductive unit 16 and an encapsulation material 18. The leadframe 12 includes a plurality of connection portions, for example, a first connection portion 20, a second connection portion 22 and a third connection portion 24. The device 14 includes a substrate 26, an active layer 28 and a plurality of electrodes 30, for example, a first electrode 32 and a second electrode 34. The active layer 28 is disposed on the substrate 26. The electrodes 30 are disposed on the active layer 28. Specifically, the electrodes 30 of the device 14 are connected to the connection portions of the leadframe 12, for example, the first electrode 32 of the device 14 is connected to the first connection portion 20 of the leadframe 12 and the second electrode 34 of the device 14 is connected to the second connection portion 22 of the leadframe 12.

Additionally, the conductive unit 16 (i.e. a clip) has a first side 16' and a second side 16". The first side 16' of the conductive unit 16 connects to the substrate 26 of the device 14. The conductive unit 16 extends and connects to at least one of the connection portions of the leadframe 12, for example, the conductive unit 16 extending and connecting to the third connection portion 24 of the leadframe 12. The encapsulation material 18 covers the device 14, the leadframe 12 and a portion of the conductive unit 16. Specifically, the second side 16" of the conductive unit 16 uncovered by the encapsulation material 18 is exposed to the outside.

In some embodiments, the connection portions of the leadframe 12 may include connection portions with high-potential and connection portions with low-potential, for example, the first connection portion 20 of the leadframe 12 connected to the electrode of the device 14 serving as a high-potential connection portion, the second connection portion 22 of the leadframe 12 connected to the electrode of the device 14 serving as a low-potential connection portion and the third connection portion 24 of the leadframe 12 serving as a low-potential connection portion.

In some embodiments, the device 14 may include a lateral power component, for example, a lateral high power component.

In some embodiments, the electrode 30 of the device 14 may include metals such as aluminum.

In some embodiments, the electrodes 30 may include a drain electrode and a source electrode, for example, the first electrode 32 serving as a drain electrode and the second electrode 34 serving as a source electrode. The drain electrode (i.e. the first electrode 32) and the source electrode (i.e. the second electrode 34) are disposed on the same plane (i.e. disposition on the active layer 28) due to the device 14 being a lateral power component.

In some embodiments, the drain electrode (i.e. the first electrode 32) may be connected to the connection portion with high-potential (i.e. the first connection portion 20) of the leadframe 12 and the source electrode (i.e. the second electrode 34) may be connected to the connection portion with low-potential (i.e. the second connection portion 22) of the leadframe 12. The electrodes 30 (i.e. the first electrode 32 and the second electrode 34) disposed above the substrate 26 of the device 14 are connected to the connection portions of the leadframe 12. Therefore, the invention adopts a flip chip technology to attach the reverse device 14 on the leadframe 12.

In some embodiments, the conductive unit 16 may include conductive metals such as copper.

In some embodiments, the conductive unit 16 may be connected from the substrate 26 of the device 14 to the connection portion with low-potential (i.e. the third connection portion 24) of the leadframe 12.

Figure 2:
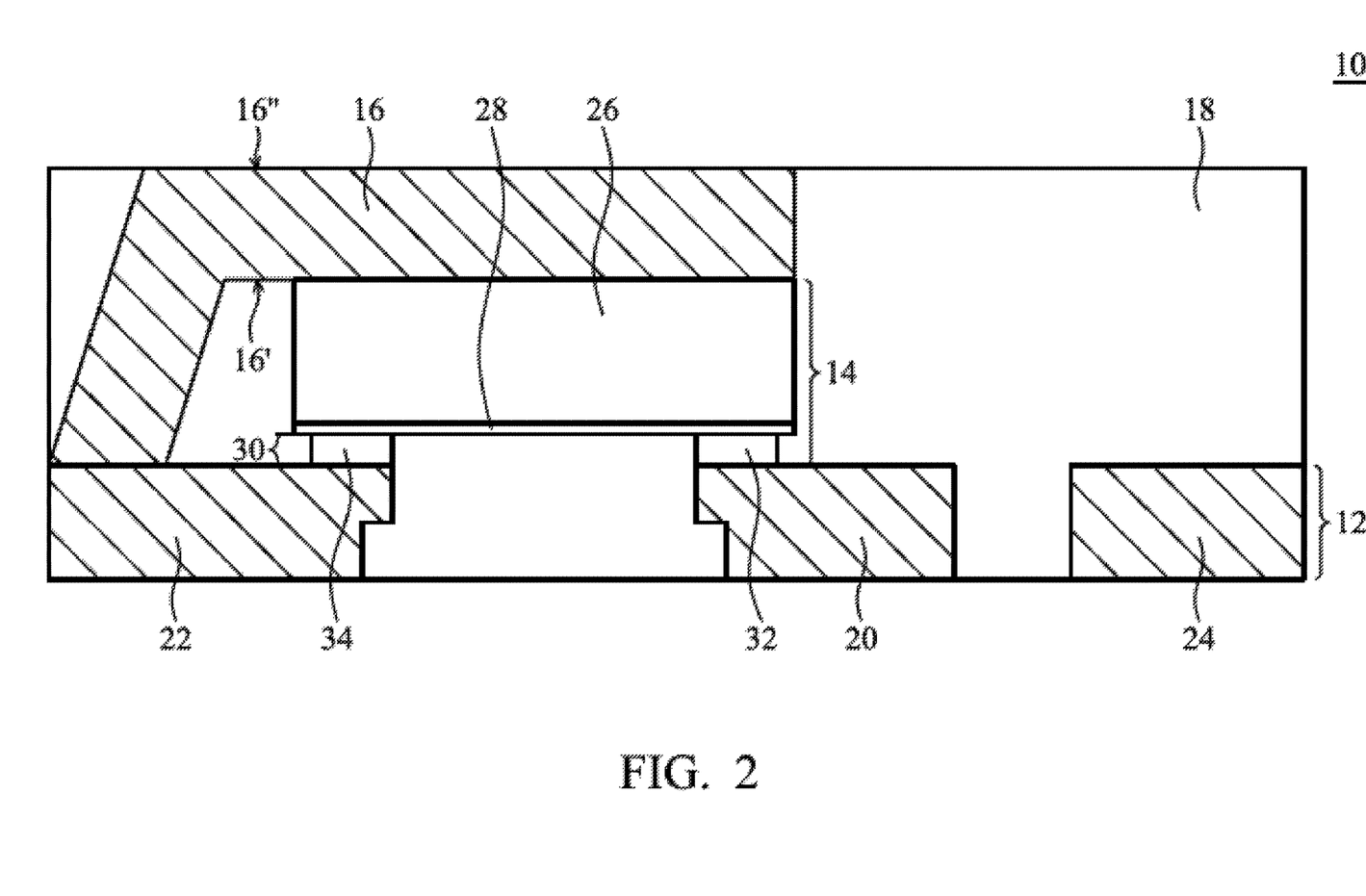
FIG. 2 is a cross-sectional view of a package structure in accordance with one embodiment of the invention.

Referring to FIG. 2, in accordance with one embodiment of the invention, a package structure 10 is provided. FIG. 2 is a cross-sectional view of the package structure 10.

The package structure 10 includes a leadframe 12, a device 14, a conductive unit 16 and an encapsulation material 18. The leadframe 12 includes a plurality of connection portions, for example, a first connection portion 20 and a second connection portion 22. The device 14 includes a substrate 26, an active layer 28 and a plurality of electrodes 30, for example, a first electrode 32 and a second electrode 34. The active layer 28 is disposed on the substrate 26. The electrodes 30 are disposed on the active layer 28. Specifically, the electrodes 30 of the device 14 are connected to the connection portions of the leadframe 12, for example, the first electrode 32 of the device 14 is connected to the first connection portion 20 of the leadframe 12 and the second electrode 34 of the device 14 is connected to the second connection portion 22 of the leadframe 12.

Additionally, the conductive unit 16 (i.e. a clip) has a first side 16' and a second side 16". The first side 16' of the conductive unit 16 connects to the substrate 26 of the device 14. The conductive unit 16 extends and connects to at least one of the connection portions of the leadframe 12, for example, the conductive unit 16 extending and connecting to the second connection portion 22 of the leadframe 12. Furthermore, the encapsulation material 18 covers the device 14, the leadframe 12 and a portion of the conductive unit 16. Specifically, the second side 16" of the conductive unit 16 uncovered by the encapsulation material 18 is exposed to the outside.

In some embodiments, the connection portions of the leadframe 12 may include connection portions with high-potential and connection portions with low-potential, for example, the first connection portion 20 of the leadframe 12 connected to the electrode of the device 14 serving as a high-potential connection portion and the second connection portion 22 of the leadframe 12 connected to the electrode of the device 14 serving as a low-potential connection portion.

In some embodiments, the device 14 may include a lateral power component, for example, a lateral high power component.

In some embodiments, the electrode 30 of the device 14 may include metals such as aluminum.

In some embodiments, the electrodes 30 may include a drain electrode and a source electrode, for example, the first electrode 32 serving as a drain electrode and the second electrode 34 serving as a source electrode. The drain electrode (i.e. the first electrode 32) and the source electrode (i.e. the second electrode 34) are disposed on the same plane (i.e. disposition on the active layer 28) due to the device 14 being a lateral power component.

In some embodiments, the drain electrode (i.e. the first electrode 32) may be connected to the connection portion with high-potential (i.e. the first connection portion 20) of the leadframe 12 and the source electrode (i.e. the second electrode 34) may be connected to the connection portion with low-potential (i.e. the second connection portion 22) of the leadframe 12. The electrodes 30 (i.e. the first electrode 32 and the second electrode 34) disposed above the substrate 26 of the device 14 are connected to the connection portions of the leadframe 12. Therefore, the invention adopts a flip chip technology to attach the reverse device 14 on the leadframe 12.

In some embodiments, the conductive unit 16 may include conductive metals such as copper.

In some embodiments, the conductive unit 16 may be connected from the substrate 26 of the device 14 to the connection portion with low-potential (i.e. the second connection portion 22) of the leadframe 12. Therefore, one of the electrodes 30 and the conductive unit 16 may be connected to the same connection portion of the leadframe 12, for example, the second electrode 34 (i.e. the source electrode) and the conductive unit 16 simultaneously connecting to the second connection portion 22 (i.e. the connection portion with low-potential) of the leadframe 12.

Figure 3:
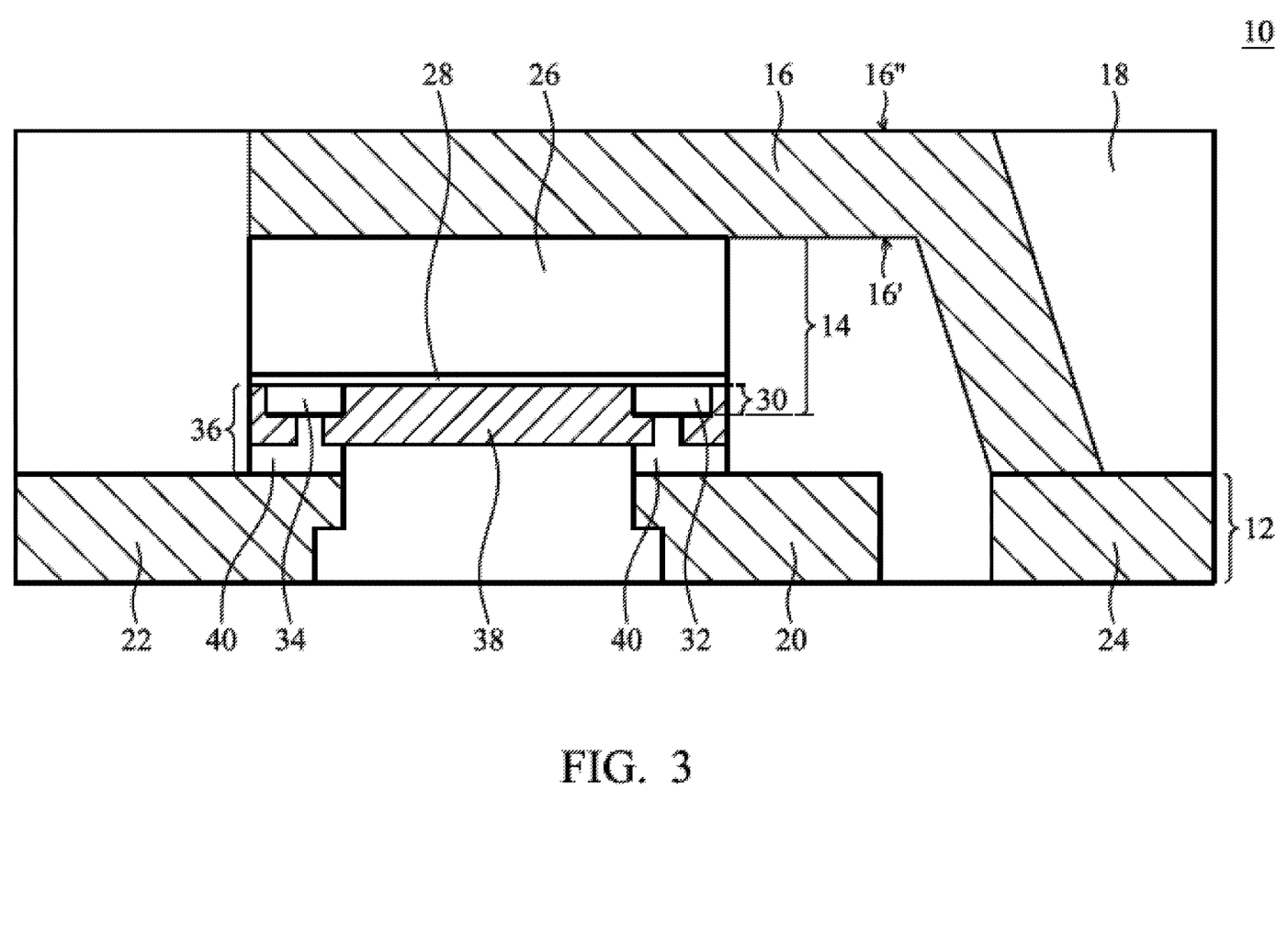
FIG. 3 is a cross-sectional view of a package structure in accordance with one embodiment of the invention.

Referring to FIG. 3, in accordance with one embodiment of the invention, a package structure 10 is provided. FIG. 3 is a cross-sectional view of the package structure 10.

The package structure 10 includes a leadframe 12, a device 14, a conductive unit 16 and an encapsulation material 18. The leadframe 12 includes a plurality of connection portions, for example, a first connection portion 20, a second connection portion 22 and a third connection portion 24. The device 14 includes a substrate 26, an active layer 28 and a plurality of electrodes 30, for example, a first electrode 32 and a second electrode 34. The active layer 28 is disposed on the substrate 26. The electrodes 30 are disposed on the active layer 28. Specifically, the electrodes 30 of the device 14 are connected to the connection portions of the leadframe 12, for example, the first electrode 32 of the device 14 is connected to the first connection portion 20 of the leadframe 12 and the second electrode 34 of the device 14 is connected to the second connection portion 22 of the leadframe 12.

Additionally, the conductive unit 16 (i.e. a clip) has a first side 16' and a second side 16". The first side 16' of the conductive unit 16 connects to the substrate 26 of the device 14. The conductive unit 16 extends and connects to at least one of the connection portions of the leadframe 12, for example, the conductive unit 16 extending and connecting to the third connection portion 24 of the leadframe 12. The encapsulation material 18 covers the device 14, the leadframe 12 and a portion of the conductive unit 16. Specifically, the second side 16" of the conductive unit 16 uncovered by the encapsulation material 18 is exposed to the outside.

In some embodiments, the connection portions of the leadframe 12 may include connection portions with high-potential and connection portions with low-potential, for example, the first connection portion 20 of the leadframe 12 connected to the electrode of the device 14 serving as a high-potential connection portion, the second connection portion 22 of the leadframe 12 connected to the electrode of the device 14 serving as a low-potential connection portion and the third connection portion 24 of the leadframe 12 serving as a low-potential connection portion.

In some embodiments, the device 14 may include a lateral power component, for example, a lateral high power component.

In some embodiments, the electrode 30 of the device 14 may include metals such as aluminum.

In some embodiments, the electrodes 30 may include a drain electrode and a source electrode, for example, the first electrode 32 serving as a drain electrode and the second electrode 34 serving as a source electrode. The drain electrode (i.e. the first electrode 32) and the source electrode (i.e. the second electrode 34) are disposed on the same plane (i.e. disposition on the active layer 28) due to the device 14 being a lateral power component.

In some embodiments, the drain electrode (i.e. the first electrode 32) may be connected to the connection portion with high-potential (i.e. the first connection portion 20) of the leadframe 12 and the source electrode (i.e. the second electrode 34) may be connected to the connection portion with low-potential (i.e. the second connection portion 22) of the leadframe 12. The electrodes 30 (i.e. the first electrode 32 and the second electrode 34) disposed above the substrate 26 of the device 14 are connected to the connection portions of the leadframe 12. Therefore, the embodiment of the invention adopts a flip chip technology to attach the reverse device 14 on the leadframe 12.

In some embodiments, the conductive unit 16 may include conductive metals such as copper.

In some embodiments, the conductive unit 16 may be connected from the substrate 26 of the device 14 to the connection portion with low-potential (i.e. the third connection portion 24) of the leadframe 12.

In some embodiments, the package structure 10 may further include a redistribution layer 36 disposed between the electrodes 30 of the device 14 and the connection portions of the leadframe 12, for example, disposition between the first electrode 32 and the second electrode 34 of the device 14 and the first connection portion 20 and the second connection portion 22 of the leadframe 12.

In some embodiments, the redistribution layer 36 may include an insulation layer 38 and a metal layer 40 disposed thereon.

In some embodiments, the insulation layer 38 of the redistribution layer 36 may include epoxy material.

In some embodiments, the metal layer 40 of the redistribution layer 36 may include copper.

Figure 4:
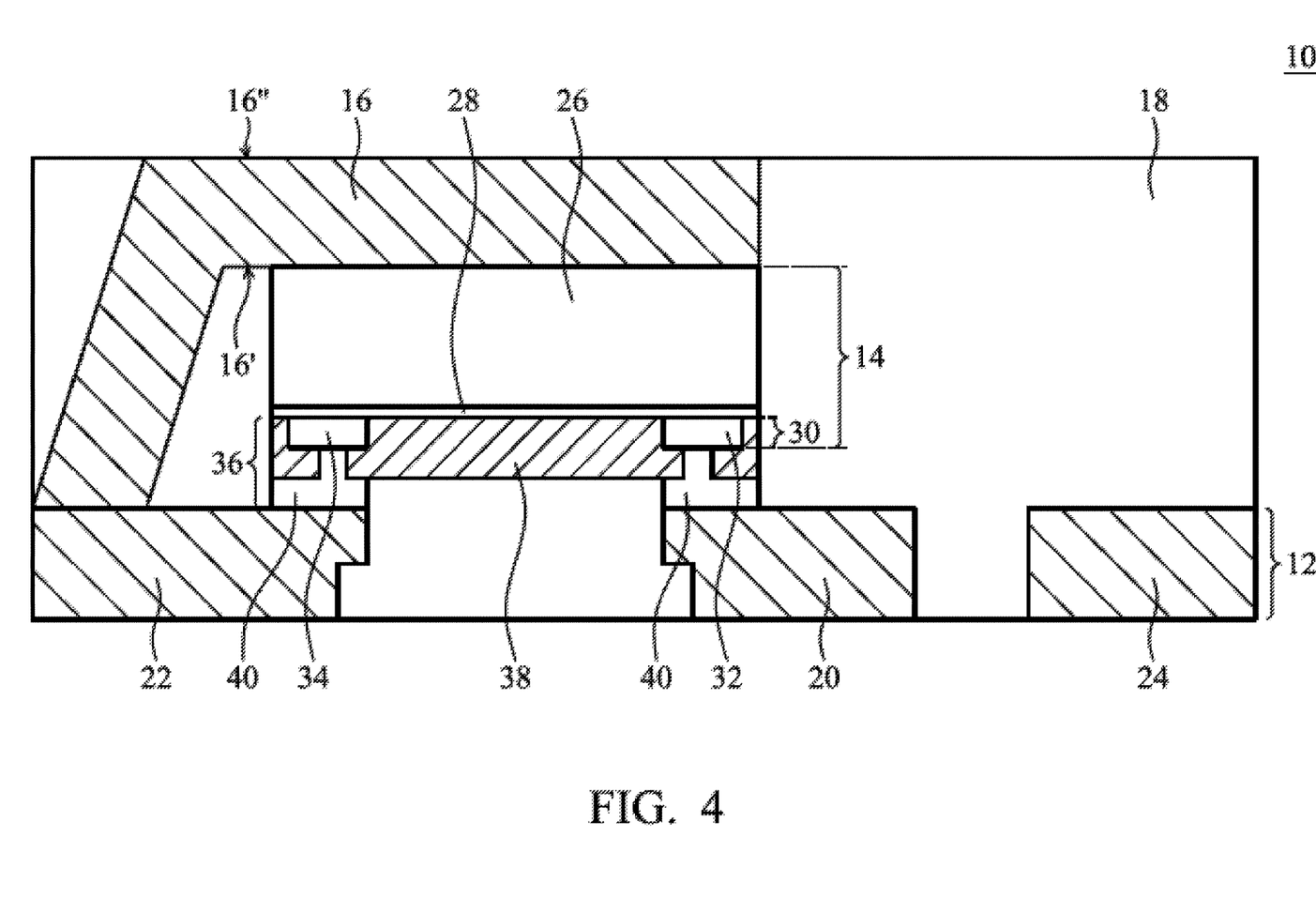
FIG. 4 is a cross-sectional view of a package structure in accordance with one embodiment of the invention.

Referring to FIG. 4, in accordance with one embodiment of the invention, a package structure 10 is provided. FIG. 4 is a cross-sectional view of the package structure 10.

The package structure 10 includes a leadframe 12, a device 14, a conductive unit 16 and an encapsulation material 18. The leadframe 12 includes a plurality of connection portions, for example, a first connection portion 20 and a second connection portion 22. The device 14 includes a substrate 26, an active layer 28 and a plurality of electrodes 30, for example, a first electrode 32 and a second electrode 34. The active layer 28 is disposed on the substrate 26. The electrodes 30 are disposed on the active layer 28. Specifically, the electrodes 30 of the device 14 are connected to the connection portions of the leadframe 12, for example, the first electrode 32 of the device 14 is connected to the first connection portion 20 of the leadframe 12 and the second electrode 34 of the device 14 is connected to the second connection portion 22 of the leadframe 12.

Additionally, the conductive unit 16 (i.e. a clip) has a first side 16' and a second side 16". The first side 16' of the conductive unit 16 connects to the substrate 26 of the device 14. The conductive unit 16 extends and connects to at least one of the connection portions of the leadframe 12, for example, the conductive unit 16 extending and connecting to the second connection portion 22 of the leadframe 12. Furthermore, the encapsulation material 18 covers the device 14, the leadframe 12 and a portion of the conductive unit 16. Specifically, the second side 16" of the conductive unit 16 uncovered by the encapsulation material 18 is exposed to the outside.

In some embodiments, the connection portions of the leadframe 12 may include connection portions with high-potential and connection portions with low-potential, for example, the first connection portion 20 of the leadframe 12 connected to the electrode of the device 14 serving as a high-potential connection portion and the second connection portion 22 of the leadframe 12 connected to the electrode of the device 14 serving as a low-potential connection portion.

In some embodiments, the device 14 may include a lateral power component, for example, a lateral high power component.

In some embodiments, the electrode 30 of the device 14 may include metals such as aluminum.

In some embodiments, the electrodes 30 may include a drain electrode and a source electrode, for example, the first electrode 32 serving as a drain electrode and the second electrode 34 serving as a source electrode. The drain electrode (i.e. the first electrode 32) and the source electrode (i.e. the second electrode 34) are disposed on the same plane (i.e. disposition on the active layer 28) due to the device 14 being a lateral power component.

In some embodiments, the drain electrode (i.e. the first electrode 32) may be connected to the connection portion with high-potential (i.e. the first connection portion 20) of the leadframe 12 and the source electrode (i.e. the second electrode 34) may be connected to the connection portion with low-potential (i.e. the second connection portion 22) of the leadframe 12. The electrodes 30 (i.e. the first electrode 32 and the second electrode 34) disposed above the substrate 26 of the device 14 are connected to the connection portions of the leadframe 12. Therefore, the invention adopts a flip chip technology to attach the reverse device 14 on the leadframe 12.

In some embodiments, the conductive unit 16 may include conductive metals such as copper.

In some embodiments, the conductive unit 16 may be connected from the substrate 26 of the device 14 to the connection portion with low-potential (i.e. the second connection portion 22) of the leadframe 12. Therefore, one of the electrodes 30 and the conductive unit 16 may be connected to the same connection portion of the leadframe 12, for example, the second electrode 34 (i.e. the source electrode) and the conductive unit 16 simultaneously connecting to the second connection portion 22 (i.e. the connection portion with low-potential) of the leadframe 12.

In some embodiments, the package structure 10 may further include a redistribution layer 36 disposed between the electrodes 30 of the device 14 and the connection portions of the leadframe 12, for example, disposition between the first electrode 32 and the second electrode 34 of the device 14 and the first connection portion 20 and the second connection portion 22 of the leadframe 12.

In some embodiments, the redistribution layer 36 may include an insulation layer 38 and a metal layer 40 disposed thereon.

In some embodiments, the insulation layer 38 of the redistribution layer 36 may include epoxy material.

In some embodiments, the metal layer 40 of the redistribution layer 36 may include copper.

In the present invention, a lateral power component is attach on a leadframe through drain and source electrodes using a flip chip technology. Current flows from the high-potential drain electrode to the low-potential source electrode through an active layer without flowing through a semiconductor substrate which is capable of avoiding parasitic resistance and inductance produced by the semiconductor substrate while operating. Additionally, the conductive unit (i.e. clip) is extended from the semiconductor substrate to the low-potential connection portion of the leadframe, replacing conventional wire bonding requiring two wires extended from both ends of the semiconductor substrate to the leadframe, which is capable of effectively reducing the entire package size.

Furthermore, the package structure with the exposed conductive unit (i.e. the package structure with at least a portion of the conductive unit uncovered by the encapsulation material) is capable of achieving a good heat dissipation effect, and improving device performance.

While the invention has been described by way of example and in terms of the embodiments, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure, comprising:
a leadframe comprising a plurality of connection portions, each of the connection portions having a first side and a second side;
a device comprising a substrate having an outermost edge, an active layer disposed on the substrate and a plurality of electrodes disposed on the active layer, wherein the electrodes of the device are connected to the first sides of the connection portions of the leadframe, wherein the leadframe is located underneath the device;
a conductive unit comprising conductive metal having a first side and a second side located above the device, wherein the first side of the conductive unit extends and terminates at the outermost edge of the substrate connects to the substrate of the device, and the conductive unit directly connects to the first side of at least one of the connection portions of the leadframe;
an encapsulation material covering the device and the leadframe, wherein the second side of the conductive unit and the second side of at least one of the connection portions of the leadframe are exposed from the encapsulation material; and
a redistribution layer comprising an insulation layer and a metal layer, wherein the insulation layer is disposed on the active layer of the device, and the metal layer is connected with the electrodes of the device and the connection portions of the leadframe.

2. The package structure as claimed in claim 1, wherein the connection portions of the leadframe comprise a first connection portion connected to the electrode of the device with high-potential and a second connection portion connected to the electrode of the device with low-potential.

3. The package structure as claimed in claim 1, wherein the device comprises a lateral power component.

4. The package structure as claimed in claim 2, wherein the electrodes comprise a source electrode and a drain electrode.

5. The package structure as claimed in claim 4, wherein the source electrode is connected to the second connection portion of the leadframe and the drain electrode is connected to the first connection portion of the leadframe.

6. The package structure as claimed in claim 1, wherein the conductive unit comprises copper.

7. The package structure as claimed in claim 2, wherein the conductive unit is connected to the second connection portion of the leadframe.

8. The package structure as claimed in claim 1, wherein the conductive unit comprises a clip.

9. A package structure, comprising:
a leadframe comprising a first connection portion and a second connection portion, each of the first connection portion and second connection portion having a first side and a second side;
a device having an outermost edge connected to the first connection portion of the leadframe with high-potential and the second connection portion of the leadframe with low-potential, wherein the leadframe is located underneath the device;
a conductive unit comprising conductive metal located above the device connected to the device wherein the conductive unit extends and terminates at the outermost edge of the device and is directly connected to the first side of the second connection portion of the leadframe with low-potential;
an encapsulation material covering the device and the leadframe, exposing at least a portion of the conductive unit and the second side of at least one of the first and the second connection portions of the leadframe; and
a redistribution layer comprising an insulation layer and a metal layer, wherein the insulation layer is disposed on an active layer of the device, and the metal layer is connected with electrodes of the device and the first and second connection portions of the leadframe.

10. The package structure as claimed in claim 9, wherein the device comprises a lateral power component.

11. The package structure as claimed in claim 9, wherein the device is connected to the first connection portion and the second connection portion of the leadframe through a plurality of electrodes disposed underneath the device.

12. The package structure as claimed in claim 11, wherein the electrodes comprise a source electrode and a drain electrode.

13. The package structure as claimed in claim 12, wherein the source electrode is connected to the second connection portion of the leadframe and the drain electrode is connected to the first connection portion of the leadframe.

14. The package structure as claimed in claim 9, wherein the conductive unit comprises copper.

15. The package structure as claimed in claim 9, wherein the conductive unit comprises a clip.

16. A package structure, comprising:
a leadframe comprising a plurality of connection portions;
a device comprising a substrate having an outermost edge, an active layer disposed on the substrate and a plurality of electrodes disposed on the active layer, wherein the electrodes of the device are connected to the connection portions of the leadframe, wherein the leadframe is located underneath the device;
a conductive unit comprising conductive metal having a first side and a second side located above the device, wherein the first side of the conductive unit extends and terminates at the outermost edge of the substrate and connects to the substrate of the device, and the conductive unit directly connects to at least one of the connection portions of the leadframe;
an encapsulation material covering the device and the leadframe, wherein the second side of the conductive unit is exposed from the encapsulation material; and
a redistribution layer comprising an insulation layer and a metal layer, wherein the insulation layer is disposed on the active layer of the device, and the metal layer is connected with the electrodes of the device and the connection portions of the leadframe.

* * * * *